United States Patent
Hayashi et al.

(10) Patent No.: US 9,786,830 B2
(45) Date of Patent: Oct. 10, 2017

(54) THERMOELECTRIC GENERATION MODULE

(71) Applicant: FUJIFILM Corporation, Tokyo (JP)

(72) Inventors: Naoyuki Hayashi, Kanagawa (JP); Eri Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/857,228

(22) Filed: Sep. 17, 2015

(65) Prior Publication Data
US 2016/0005948 A1  Jan. 7, 2016

Related U.S. Application Data

(63) Continuation of application No. PCT/JP2014/057507, filed on Mar. 19, 2014.

(30) Foreign Application Priority Data

Mar. 29, 2013  (JP) .................. 2013-073480

(51) Int. Cl.
| | |
|---|---|
| H01L 35/32 | (2006.01) |
| H01L 37/00 | (2006.01) |
| H01L 35/24 | (2006.01) |
| H01L 35/10 | (2006.01) |
| H01M 10/42 | (2006.01) |
| H01L 35/08 | (2006.01) |

(52) U.S. Cl.
CPC .............. *H01L 35/32* (2013.01); *H01L 35/08* (2013.01); *H01L 35/10* (2013.01); *H01L 35/24* (2013.01); *H01L 37/00* (2013.01); *H01M 10/425* (2013.01)

(58) Field of Classification Search
CPC .......... H01L 35/32; H01L 35/40; H01L 35/24
See application file for complete search history.

(56) References Cited

U.S. PATENT DOCUMENTS

| | | | | |
|---|---|---|---|---|
| 6,936,653 | B2 * | 8/2005 | McElrath | B82Y 10/00 423/445 R |
| 2009/0084423 | A1 * | 4/2009 | Horio | H01L 23/145 136/241 |
| 2010/0054502 | A1 | 3/2010 | Miyachi | |
| 2010/0095995 | A1 * | 4/2010 | Toyoda | H01L 35/22 136/200 |

(Continued)

FOREIGN PATENT DOCUMENTS

| | | |
|---|---|---|
| JP | 63-102382 A | 5/1988 |
| JP | 8-46249 A | 2/1996 |

(Continued)

OTHER PUBLICATIONS

Machine translation JP 200818092, accessed Jun. 26, 2016.*

(Continued)

*Primary Examiner* — Shannon Gardner
(74) *Attorney, Agent, or Firm* — Sughrue Mion, PLLC

(57) ABSTRACT

A thermoelectric generation module having: a base material; a plurality of electrodes disposed on the base material; and a thermoelectric conversion layer that coats each of the electrodes individually leaving a portion of the electrode to which a wiring is to be connected, wherein the thermoelectric conversion layer adheres to the base material around the electrode excluding the portion of the electrode to which the wiring is to be connected.

12 Claims, 8 Drawing Sheets

(56) References Cited

U.S. PATENT DOCUMENTS

2011/0217455 A1\* 9/2011 Veerasamy ............ B82Y 10/00
427/122

FOREIGN PATENT DOCUMENTS

| JP | 2005-209718 A | 8/2005 |
| --- | --- | --- |
| JP | 2005-340565 A | 12/2005 |
| JP | 2007-35907 A | 2/2007 |
| JP | 2008-182092 A | 8/2008 |
| JP | 2010-199276 A | 9/2010 |
| JP | 2011-29295 A | 2/2011 |
| JP | 2011-192923 A | 9/2011 |
| WO | 2008/029451 A1 | 3/2008 |

OTHER PUBLICATIONS

Machine translation JP 2011029295, accessed Jun. 26, 2016.\*
Communication dated Nov. 24, 2015 from the Japanese Patent Office issued in corresponding application No. 2013-073480.
International Search Report for PCT/JP2014/057507 dated Jun. 24, 2014 [PCT/ISA/210].

\* cited by examiner

*Fig. 12(a)* Resistance A

*Fig. 12(b)* Resistance B

THERMOELECTRIC GENERATION MODULE

CROSS-REFERENCE TO RELATED APPLICATIONS

This application is a Continuation of PCT International Application No. PCT/JP2014/057507 filed on Mar. 19, 2014, which claims priority under 35 U.S.C. §119 (a) to Japanese Patent Application No. 2013-073480 filed in Japan on Mar. 29, 2013. Each of the above applications is hereby expressly incorporated by reference, in its entirety, into the present application.

TECHNICAL FIELD

The present invention relates to a thermoelectric generation module.

BACKGROUND ART

A thermoelectric conversion material that allows mutual conversion between heat energy and electric energy is used for a thermoelectric conversion element, such as a thermoelectric generation device and a Peltier device. In thermoelectric generation module applying the thermoelectric conversion material, such an advantage is obtained that heat energy can be directly converted into electric power, and that a movable part is not required, and thus the thermoelectric generation module is used for a power supply for a wrist watch operated by body temperature, a medical equipment, a power supply for remote districts which utilizes a wasted heat, a space power supply, or the like.

The thermoelectric generation module is often used by looping it around the curved surface, such as a pipe, an arm, a trunk of the body, and the like. It is therefore required that even if the thermoelectric generation module is inflected, a thermoelectric conversion layer follows the inflection, without being peeled-off from a base material of the thermoelectric generation module.

Patent Literatures 1 and 2 disclose that a thermoelectric element is disposed on an electrode. Patent Literature 3 discloses that, in accordance with a printing method, after forming a resin-made insulator having voids of 100 rows and 3 columns on a polyethylene terephthalate film support, a conductive layer is formed in each of the voids, and further a thermoelectric conversion layer (p-type semiconductor element and n-type semiconductor element) is formed.

In every case, the thermoelectric element (the thermoelectric conversion layer) is formed only on an electrode (a conductive layer).

CITATION LIST

Patent Literatures

Patent Literature 1: JP-A-2007-35907 ("JP-A" means unexamined published Japanese patent application)
Patent Literature 2: JP-A-2005-340565
Patent Literature 3: JP-A-2010-199276

SUMMARY OF INVENTION

Technical Problem

In the inventions described in Patent Literatures 1 and 2, the thermoelectric element is formed only on an electrode, and in the invention described in Patent Literature 3, the thermoelectric conversion layer is formed only on a conductive layer. As a result, when the substrate is bent, the thermoelectric element or the thermoelectric conversion layer is easily peeled-off from the electrode or the conductive layer.

The present invention is to provide a thermoelectric generation module having improved adhesion between a thermoelectric conversion layer or/and an electrode and a base material (i.e. a substrate), thereby improving flexibility.

Solution to Problem

According to the present invention, there is provided the following means:

(1) A thermoelectric generation module having: a resin-made base material; a plurality of electrodes disposed on the base material; and a resin-made thermoelectric conversion layer that coats each of the electrodes individually leaving a portion of the electrode to which a wiring is to be connected, wherein the thermoelectric conversion layer adheres to the base material around the electrode excluding the portion of the electrode to which the wiring is to be connected.

(2) The thermoelectric generation module described in the item (1), wherein the thermoelectric conversion layer adheres to the base material around the electrode on a lower side of the wiring that is connected to at least the thermoelectric conversion layer.

(3) The thermoelectric generation module described in the item (1) or (2), wherein the thermoelectric conversion layer adheres to the base material around the electrode on a lower side of the wiring that is connected to at least the thermoelectric conversion layer, and wherein a width of an adhered portion of the thermoelectric conversion layer and the base material is wider than a thickness of the thermoelectric conversion layer.

(4) The thermoelectric generation module described in any one of the items (1) to (3), wherein an easy adhesion layer lies between at least the base material and the thermoelectric conversion layer, and wherein the thermoelectric conversion layer adheres, via the easy adhesion layer as an adhesion layer, to the base material around the electrode excluding the portion of the electrode to which the wiring is to be connected.

(5) The thermoelectric generation module described in any one of the items (1) to (3), wherein a conductive resin layer lies between at least the base material and the electrode and the thermoelectric conversion layer, and wherein the thermoelectric conversion layer adheres, via the conductive resin layer as an adhesion layer, to the base material of the electrode and around the electrode excluding the portion of the electrode to which the wiring is to be connected.

(6) The thermoelectric generation module described in the item (5), wherein electric conductivity of the thermoelectric conversion layer is higher than the conductive resin layer.

(7) The thermoelectric generation module described in any one of the items (1) to (6), wherein a background surface of the thermoelectric conversion layer, that is the side of at least the thermoelectric conversion layer to be adhered, has an energy ray-irradiated surface-modified face, and wherein with the use of the surface-modified face as an adhesion surface, the thermoelectric conversion layer adheres to the base material around the electrode excluding the portion of the electrode to which the wiring is to be connected.

(8) The thermoelectric generation module described in any one of the items (1) to (7), having a wiring that electrically connects the thermoelectric conversion layer with a portion of other electrode to which the wiring is to be connected, wherein the other electrode is adjacent to the electrode coating the thermoelectric conversion layer.

(9) The thermoelectric generation module described in any one of the items (1) to (8), mounting a secondary battery that is electrically connected to an output portion of the thermoelectric conversion layer.

(10) The thermoelectric generation module described in the item (9), mounting an electronic device connected to the secondary battery.

Advantageous Effects of Invention

According to the thermoelectric generation module of the present invention, by the reason that the thermoelectric conversion layer is adhered to the base material around the electrode, a stronger adhesion force is obtained than the adhesion on the electrode and, therefore, the thermoelectric conversion layer becomes difficult to peel-off from the base material. As a result, flexibility of the thermoelectric generation module is improved, so that the thermoelectric generation module having resistance to bending can be provided.

This allows mounting to the flexible base material and lowering of peeling-off of the thermoelectric conversion layer due to bending, or associated with thermal expansion or thermal shrinkage, thereby for enabling provision of a reliable thermoelectric generation module.

Other and further features and advantages of the invention will appear more fully from the following description, appropriately referring to the accompanying drawings.

BRIEF DESCRIPTION OF DRAWINGS

FIG. 1(a) is a plan view; and FIG. 1(b) is an A-A' line cross-sectional view in FIG. 1(a).

FIG. 2(a) is a plan view; and FIG. 2(b) is a cross-sectional view in the array direction.

FIG. 12(a) is a cross-sectional view showing a measuring method of resistance value between the electrode and the thermoelectric conversion element; and FIG. 12(b) is a cross-sectional view showing a measuring method of resistance value among the electrode, the thermoelectric conversion element, and the wiring.

DESCRIPTION OF EMBODIMENTS

A detailed explanation about a preferable embodiment of the thermoelectric generation module of the present invention is given below on the basis of FIGS. 1 and 2. Note that the present invention is not construed as being limited by the explanation of this embodiment.

Figure 1A:
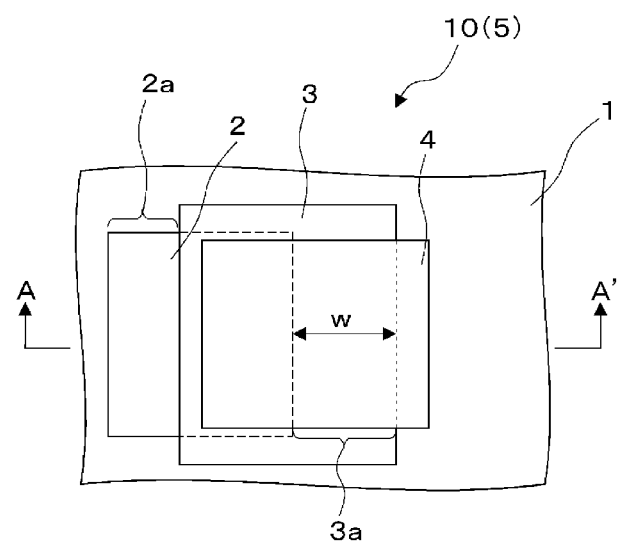
FIG. 1(a) and FIG. 1(b) each are a view schematically showing a configuration of the thermoelectric conversion element array of the thermoelectric generation module for explaining an embodiment of the present invention.
Figure 1B:
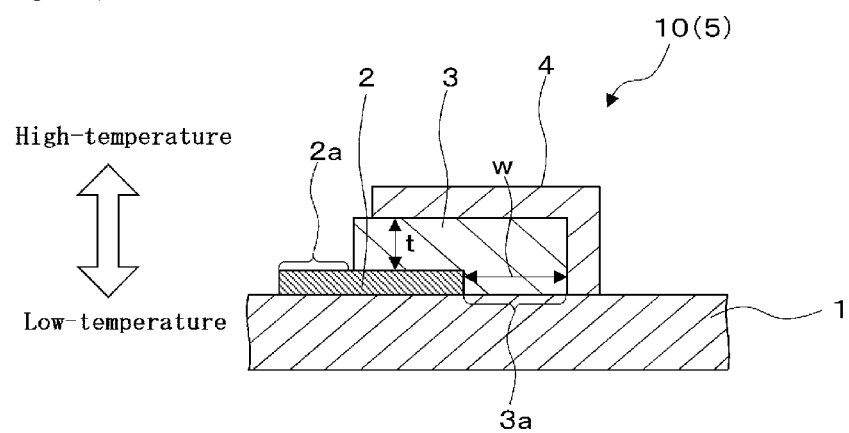

As shown in FIG. 1, a thermoelectric generation module 10 of this embodiment has a plurality of electrodes 2 disposed on a principal surface of a resin-made base material 1, and a resin-made thermoelectric conversion layer 3 that coats each of the electrodes 2 individually while leaving a portion 2a of the electrode 2 to which a wiring is to be connected. The thermoelectric conversion layer 3 is adhered to both a surface of the electrode 2 and the base material 1 around the electrode 2 excluding the portion 2a of the electrode 2 to which the wiring is to be connected.

Further, wiring 4 is disposed so as to electrically connect the thermoelectric conversion layer 3 with a portion (not shown) of the other electrode to which a wiring is to be connected, in which the other electrode is adjacent to the electrode 2 (21) coating the thermoelectric conversion layer 3. The wiring 4 is disposed not to connect to the electrode 2 (21). The graphically-illustrated wiring 4 has a smaller width than the electrode 2 or the thermoelectric conversion layer 3. However, the width of the wiring 4 may be equal to or broader than the electrode 2 or the thermoelectric conversion layer 3. In this way, the thermoelectric conversion element 5 of the thermoelectric generation module 10 is constituted.

The thermoelectric conversion element 5 of the thermoelectric generation module 10 is used in such a way that the side of the wiring 4 on the thermoelectric conversion layer 3 acts as a high-temperature side, while the side of the electrode 2 acts as a low-temperature side, and generates an electric energy according to a temperature difference between the wiring 4 and the electrode 2.

Specifically, a potential difference is caused by transfer of positive charge (positive hole) from the side of the wiring 4 having a high temperature to the side of the electrode 2 having a low temperature, inside the thermoelectric conversion layer 3, whereby a thermal electromotive force is generated. This electromotive phenomenon is called as Seebeck effect.

As to adhesion between the thermoelectric conversion layer 3 and the base material 1, there is no particular limitation to the shape or the area, as long as the place is other than the location excluding the portion 2a of the electrode 2 to which a wiring is to be connected. For example, in the rectangular (quadrangular) electrode 2 shown in FIG. 1, out of 3 sides around the electrode 2 excluding the portion 2a of the electrode 2 to which a wiring is to be connected, the region of the base material 1 having contact with any 1 side, arbitrary 2 sides, or 3 sides may be used as a region (hereinafter referred to as an "adhesion portion") to which the thermoelectric conversion layer 3 is adhered. From the viewpoint of improvement in adhesion strength, the region of the base material 1 having contact with arbitrary 2 sides or 3 sides is preferably used as a adhesion portion 3a, and all of the regions of the base material 1 having contact with the 3 sides are more preferably used. In the location below the wiring 4 which is connected to at least the thermoelectric conversion layer 3, it is preferable that the thermoelectric conversion layer 3 is adhered to the base material 1 around the electrode 2. By applying the adhesion portion in this way, the adhesion between the thermoelectric conversion layer 3 and the base material 1 is more consolidated.

Further, the region of the base material 1 which has contact with the side of the electrode 2 on the side to which the wiring 4 is connected may be also used as an adhesion portion, as long as short circuit does not occur between the electrode 2 which the thermoelectric conversion layer 3 coats and the wiring 4 which is to be connected to the electrode 2. By applying such an adhesion portion in this way, the adhesion between the thermoelectric conversion layer 3 and the base material 1 is more consolidated.

There is no particular limitation to the width w of the adhesion portion 3a, as long as short circuit does not occur among the thermoelectric conversion layer, the electrode, and the wiring, all of which are adjacent to each other.

Note that even if the shape of the electrode 2 is a triangle, a polygon, a circle, a tetragon having rounded corners, or the like, a region of the base material 1 which has contact with a side or a part of the side other than the location excluding the portion 2a of the electrode 2 to which a wiring is to be connected, can be used as an adhesion portion 3a of the thermoelectric conversion layer 3. The tetragon having rounded corners means a tetragon whose corners have a curvature.

Further, by applying the adhesion portion 3a where thermoelectric conversion layer 3 is adhered to the base material 1 in the region below the wiring 4 which is connected to the thermoelectric conversion layer 3, any short circuit between the wiring 4 and the electrode 2 on the base material 1 can be prevented, and also recombination of electrons generated by a Seebeck effect inside the wiring 4 and positive holes generated by a Seebeck effect inside the thermoelectric conversion layer 3 can be prevented, so that an effect on increase of output power can be expected.

At this time, it is preferable that, in the region below the wiring 4 connected to at least the thermoelectric conversion layer 3, the thermoelectric conversion layer 3 is adhered to the base material 1 around the electrode 2. It is preferable that the width w of the adhesion portion 3a is equal to or wider than the thickness t of the thermoelectric conversion layer 3. From the viewpoint of a balance between increase of output voltage and adhesiveness, it is more preferable that the width w is at least 2 times wider than the thickness t.

Figure 2A:
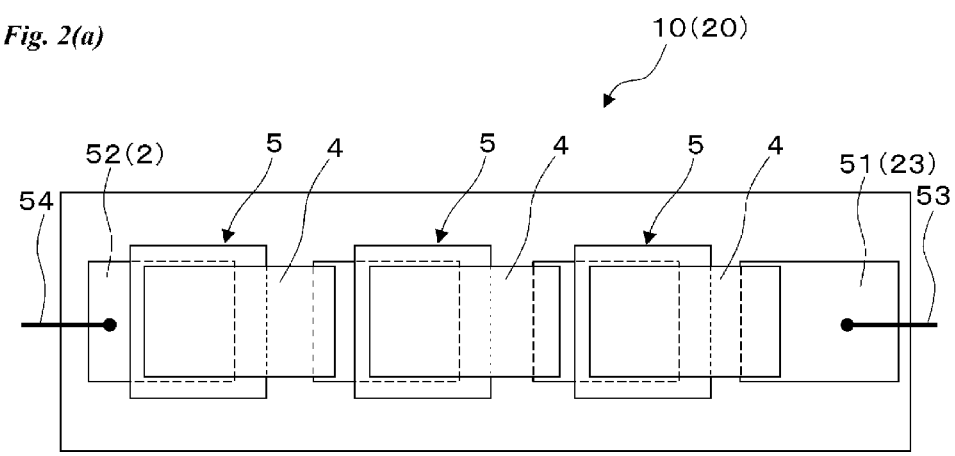
FIG. 2(a) and FIG. 2(b) each are a view showing an example of the thermoelectric conversion element array.
Figure 2B:
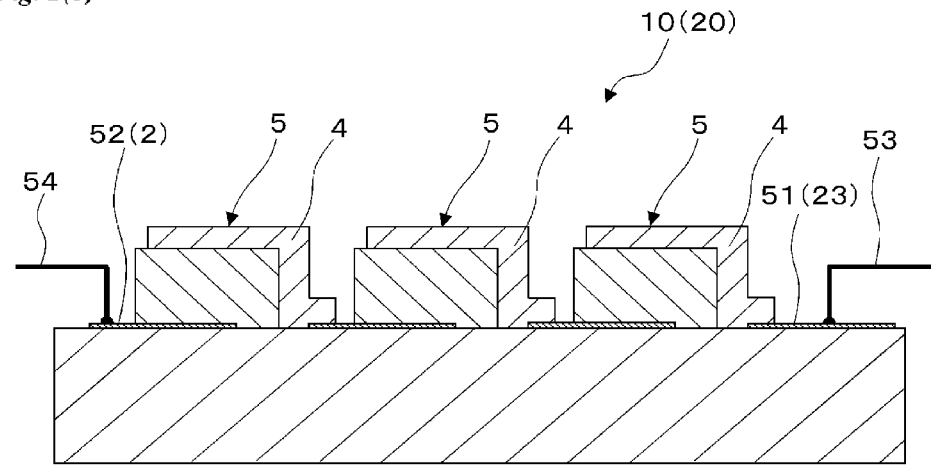

Further, as shown in FIG. 2, a plurality of thermoelectric conversion elements 5 are electrically connected in series with wiring 4, to constitute the thermoelectric generator 20 of the thermoelectric generation module 10.

Figure 3:
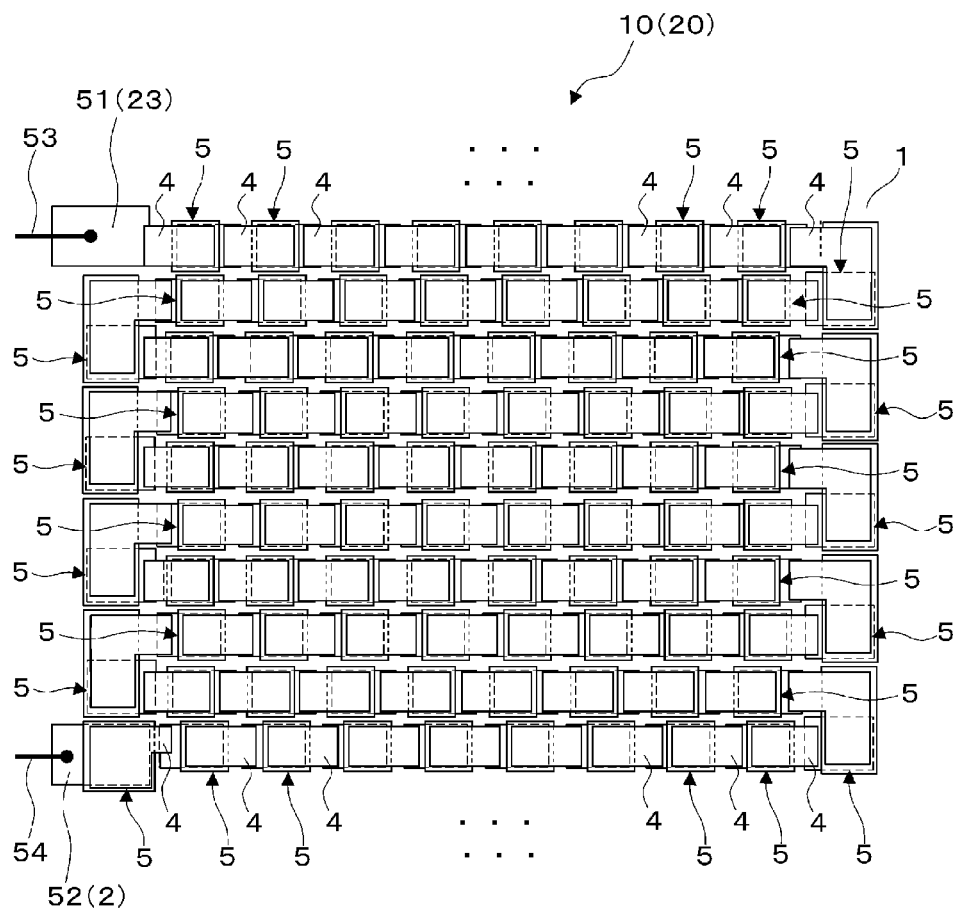
FIG. 3 is a plan view showing an example of the thermoelectric generator constituted by arranging thermoelectric conversion elements in a matrix on the base material.

Further, as shown in FIG. 3, the thermoelectric conversion elements 5 may be arranged in a matrix on the base material 1, and electrically and sequentially connected in series with the wiring 4, to constitute the thermoelectric generator 20 of the thermoelectric generation module 10. In other words, this is a configuration in which thermoelectric conversion element 5 are sequentially and electrically connected in series in a broken-line shape. Note that the number of allays of the thermoelectric conversion element 5 shown in FIG. 3 is one line. The number of allays of the thermoelectric conversion element 5 is therefore determined appropriately, by an electromotive force per one thermoelectric conversion element 5 and an electromotive force as the thermoelectric generator 20.

Further, as shown in FIGS. 2 and 3, both ends of the thermoelectric conversion elements 5 connected in series act as output terminals 51 and 52, respectively, to which output wirings 53 and 54 are connected, respectively. As the output terminals 51 and 52, use may be made of the electrode 2, the wiring 4, or an electrode 23 which connects to the wiring 4, all of which are in the thermoelectric conversion elements 5.

In this way, the thermoelectric conversion element 5 is electrically connected in series. As a result, electric current flows in one direction and thermal electromotive force generated by each thermoelectric conversion element 5 is added, so that a desired electric energy can be generated by output of the electric current to the outside.

As the base material 1, any of base materials, such as plastic films having flexibility, and the like are exemplified. The plastic films, which are inexpensive and have flexibility, are preferred.

From the viewpoints mentioned in above, the base material 1 preferably includes specific examples of: a polyester resin film, such as a poly(ethylene terephthalate) film, a poly(ethylene isophthalate) film, a poly(ethylene naphthalate) film, a poly(butylene terephthalate) film, a poly(1,4-cyclohexylene dimethylene terephthalate) film, and a poly(ethylene-2,6-phthalenedicarboxylate) film; the plastic film (a resin film) includes: a polyimide film; a polycarbonate film; a polypropylene film; a polyether sulfone film; a cycro-olefin polymer; a poly(ether ether ketone) (PEEK) film; and a triacetyl cellulose (TAC) film; as well as a glass epoxy film, and a liquid crystalline polyester film.

Of these materials, from the viewpoints of availability and economy, and as a base material which is printable without dissolution with a solvent, poly(ether ether ketone), poly(ethylene terephthalate), poly(ethylene naphthalate), polyimide, glass epoxy, and liquid-crystalline polyester are preferred, and poly(ethylene terephthalate), poly(ethylene naphthalate), polyimide, glass epoxy, and liquid crystalline polyester are particularly preferred.

Further, in so far as the effect of the base material is not damaged, use may be made of: any of copolymers of the above resins, a blend of any of these resins and any of other kinds of resins, or the like.

Further, in the resin film, in order to improve sliding property, contained may be a small amount of inorganic or organic fine particles: for example, an inorganic filler, such as titanium oxide, calcium carbonate, silica, barium sulfate, silicone, and the like; and an organic filler, such as acryl, benzoguanamine, TEFLON (registered trademark), epoxy, and the like; and an adhesion-improving agent or antistatic agent, such as polyethylene glycol (PEG), sodium dodecyl benzene sulfonate, and the like.

For the production method of the individual resin film, known methods and conditions may be adequately selected and used. For example, a polyester film can be formed, by melt-extruding a polyester resin into a film, and subjecting the film to orientation crystallization by a horizontal and vertical biaxial stretching, and then to crystallization by a heat treatment.

There is no particular limitation to the thickness of the base material 1 to be used in this embodiment. Ordinarily, in terms of the thickness of the resin film which forms a base material, a film having the thickness of 5 µm or more and 1,000 µm or less is used, and from the viewpoint of flexibility, a film having the thickness of 10 µm or more and 500 µm or less is preferably used, and a film having the thickness of 10 µm or more and 250 µm or less is still more preferably used.

In the base material 1, from the viewpoint of deterioration prevention, any of additives, such as an ultraviolet absorber, is preferably contained. As the ultraviolet absorber, use may be preferably made of: an oxazole-based, triazine-based, stilbene-based, or coumalin-based ultraviolet absorber.

As for the electrode 2, use may be made of any of known materials, including: a metal electrode, such as copper, silver, gold, platinum, nickel, chromium, or copper alloy; a transparent electrode, such as indium tin oxide (ITO), zinc oxide (ZnO), or the like; and the like. Any of copper, gold, platinum, nickel, or copper alloy is preferably used. Any of gold, platinum, or nickel is more preferably used. Alternatively, a solidified metal paste may be used, which has been formed by microparticulating the above metal, and adding a binder and a solvent to the microparticulated metal.

The thermoelectric conversion layer 3 has a carbon nanotube (hereinafter, which may be referred to as CNT) and a resin layer which acts as a binder. The resin layer which acts as a binder, includes: a vinyl compound, a (meth)acrylate compound, a carbonate compound, and an ester compound. Examples of the vinyl compound include: polystyrene, poly(vinylnaphthalene), poly(vinyl acetate), poly(vinylphenol), poly(vinylbutyral), and the like. Examples of the (meth)acrylate compound include: poly{methyl(meth)acrylate}, poly{ethyl(meth)acrylate}, poly{phenoxy (poly)ethyleneglycol (meth)acrylate}, poly{benzyl(meth)acrylate}, and the like. Examples of the carbonate compound include: bisphenol Z-type polycarbonate, bisphenol C-type polycarbonate, and the like. Examples of the ester compound include: non-crystalline polyesters.

Preferable examples thereof include: poly(vinylbutyral), a (meth)acrylate compound, a carbonate compound, and an ester compound. More preferable examples thereof include: poly(vinylbutyral), poly{phenoxy(poly)ethyleneglycol (meth)acrylate}, poly{benzyl(meth)acrylate}, and a non-crystalline polyester.

Note that, as well as CNT, any of nanocarbons may be contained, such as carbon nanohorn, carbon nanocoil, carbon nanobeads, graphite, graphene, amorphous carbon, and the like.

The wiring 4 can be formed by utilizing any of a conductive paste having dispersed therein conductive fine-particles, such as silver, carbon, and the like, or a conductive paste containing a metal nanowire, such as silver, copper, aluminum, and the like.

Utilization of the conductive paste enables wiring which follows a difference in level between a top surface of the thermoelectric conversion layer and the electrode on the base material, so that connection can be achieved without disconnection of wore(s) and contact failure. As a result, a reliable module generating high-output power can be formed.

Note that wiring may be achieved, by utilizing any of known conductive materials including a metal, such as gold, silver, copper, and nickel, an alloy of any of these metals, an oxide semiconductor material, such as indium tin oxide (ITO), and the like, according to a combination with sputtering, vacuum deposition and a metal mask method.

In the thermoelectric generation module 10 having the thermoelectric generator 20, a resin-made thermoelectric conversion layer 3 adheres to a resin-made base material 1 around the electrode 2 excluding the portion of the electrode 2 to which a wiring is to be connected, thereby for obtaining a stronger adhesion force than the electrode 2 composed of a metal. This allows improvement in flexibility of the thermoelectric generation module 10, so that the thermoelectric generation module 10 which has resistance to bending can be provided.

Further, the thermoelectric generation module 10 is excellent in flexibility, because it has the resin-made thermoelectric conversion layer 3 provided on the resin-made base material 1. In particular, a part of the thermoelectric conversion layer 3 is adhered to the resin-made base material 1 in such a way as to protrude to the side of the resin-made base material 1 over the electrode 2, thereby for becoming adhesion property between the base material 1 and the thermoelectric conversion layer 3 strong. This makes it difficult for the thermoelectric conversion layer 3 to be peeled-off from above the electrode 2, even if the base material 1 is bent. As a result, durability to bending can be obtained, thereby for attaining resistance to the repeated use. Further, the above thermoelectric conversion layer 3 is made of a resin, and therefore it can be prepared by coating. This enables the thermoelectric conversion layer 3 to be prepared so that adhesion property with respect to the base material 1 is consolidated much more, without damaging the base material 1.

Figure 4:
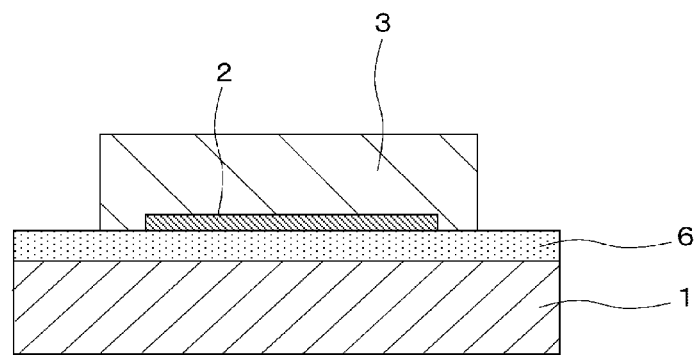
FIG. 4 is a cross-sectional view showing an example of the thermoelectric conversion element of the thermoelectric generation module having the easy adhesion layer formed on the base material.

Further, as shown in FIG. 4, on the base material 1, the thermoelectric generation module 10 preferably has an easy adhesion layer 6 which enhances surface adhesion property. In this configuration, the electrode 2 is disposed on a surface of the easy adhesion layer 6 as an adhesion layer, and the thermoelectric conversion layer 3 is adhered to the easy adhesion layer 6 around the electrode 2 excluding the portion (see FIG. 1) of the electrode 2 to which a wiring is connected.

Materials of the easy adhesion layer 6 include gelatin, a poly(vinyl alcohol) (PVA), an acrylic resin, a polyurethane resin, a polyester resin, or the like. Preferably, an acrylic resin, a polyurethane resin, and a polyester resin are exemplified. Further, a cross-linking agent, such as a carbodiimide cross-linking agent, an isocyanate cross-linking agent, a melamine cross-linking agent, or the like may be contained therein.

By forming the easy adhesion layer 6, an adhesion force of the thermoelectric conversion layer 3 can be further enhanced.

Figure 5:
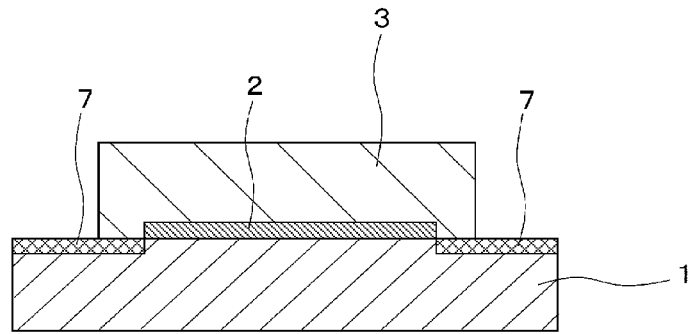
FIG. 5 is a cross-sectional view showing an example of the thermoelectric conversion element of the thermoelectric generation module, in which, after forming the electrode on the base material, a surface of the base material is made to have a surface-modified face.
Figure 6:
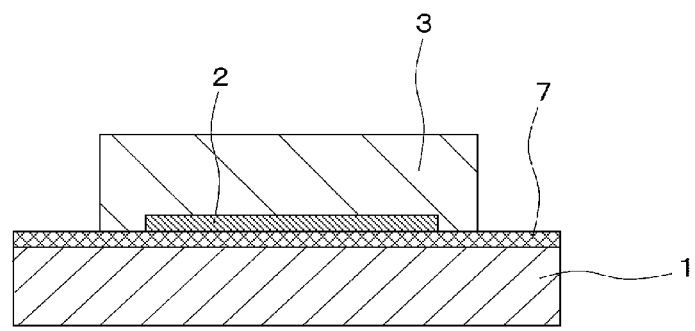
FIG. 6 is a cross-sectional view showing an example of the thermoelectric conversion element of the thermoelectric generation module, in which, after making a surface of the base material to have a surface-modified face, the electrode is formed on the base material.

Further, as shown in FIG. 5, it is preferred that, after formation of the electrode 2 on the base material 1, but before formation of the thermoelectric conversion layer 3, a surface-modified layer 7 is been formed, which has a surface-modified face obtained by irradiating energy ray on the surface of the base material 1. Further, as shown in FIG. 6, it is preferred that, before formation of the electrode 2 and the thermoelectric conversion layer 3 on the base material 1, a surface-modified layer 7 is been formed, which has a surface-modified face obtained by irradiating energy ray on the surface of the base material 1.

Therefore, the surface-modified layer 7 is preferably formed at least on the surface of the base material 1 to be located in the back surface portion of the thermoelectric conversion layer 3.

As to a surface-modification treatment which is performed by energy-ray irradiation, it is possible to use any of known treatments, such as a corona treatment using corona discharge, a plasma treatment with exposure to plasma atmosphere, a UV ozone treatment with ultraviolet irradiation in ozone atmosphere, an EB irradiation treatment with electron beam irradiation, and the like. Preferably, the plasma treatment, the corona treatment, and the UV ozone treatment are exemplified. By these treatments, a hydroxyl group, a carboxyl group, a basic group, or the like, each of which has polarity, can be formed on the surface of the base material, so that adhesion property to the thermoelectric conversion layer 3 are further improved.

Alternatively, an adhesion force may be increased, by roughening the surface of the base material 1 due to irradiation of energy ray to obtain the surface-modified face, and resultantly by enlarging a surface area to increase an area of adhesion between the base material 1 and the thermoelectric conversion layer 3.

The surface-modified layer 7 may be formed on the surface of the easy adhesion layer 6 (see FIG. 4) or the surface of the conductive resin layer described below. This enables increase in an adhesion force between the thermoelectric conversion layer 3 and the surface of the easy adhesion layer 6 or the surface of the conductive resin layer, respectively, to be located in the back surface portion of the thermoelectric conversion layer 3.

Having the surface-modified face allows improvement in adhesion property of a metal wiring layer or a protective layer, although these layers are not shown. This enables coating of a water-soluble resin high in oxygen barrier property, such as poly(vinylalcohol) (PVA), poly(vinylpyrrolidone) (PVP), or the like, as a protective layer in particular. By this means, aged deterioration of the thermoelectric conversion element can be suppressed, so that durability is improved dramatically.

Figure 7:
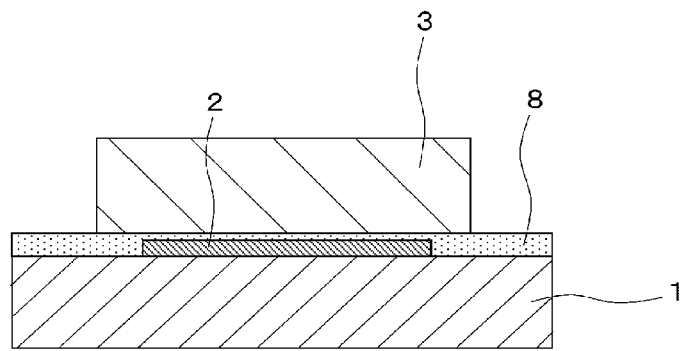
FIG. 7 is a cross-sectional view showing an example of the thermoelectric conversion element of the thermoelectric generation module having formed therein the conductive resin layer coating both the base material and the electrode.

Further, as shown in FIG. 7, it is preferred that a conductive resin layer 8 is placed on the base material 1 and the electrode 2, and the thermoelectric conversion layer 3 is arranged on the conductive resin layer 8, and the thermoelectric conversion layer 3 adheres to the conductive resin layer 8 on a top of the electrode 2 excluding the portion (see FIG. 1) of which a wiring on the top of the electrode 2 is to be connected and the conductive resin layer 8 around the electrode 2. By this configuration, the conductivity of the thermoelectric conversion layer 3 is set to a higher level than the conductive resin layer 8.

In the configuration having the conductive resin layer 8, the electrode 2 is coated with the conductive resin layer 8, and the thermoelectric conversion layer 3 is arranged on this conductive resin layer 8, and as a result, a direct adhesion between the thermoelectric conversion layer 3 and the electrode 2 (a metal electrode) which is poor in adhesion property, is avoid, which results in adhesion to the conductive resin layer 8, and which the adhesion property is therefore improved.

Further, since the conductivity of the thermoelectric conversion layer 3 is higher than the conductive resin layer 8, a flow of electric current between the electrode 2 and the thermoelectric conversion layer 3 becomes easy by intervention of the conductive resin layer 8 between those. In a similar way, by adjusting the conductivity of a wiring (see FIG. 1) to a higher level than the conductive resin layer 8, a flow of electric current between the wiring and the electrode 2 becomes easy. Therefore, since no electric current does flow in the surface direction of the conductive resin layer 8, the electric current does not flow directly between the electrode 2 and the other electrode 2 adjacent thereto.

Examples of the conductive resin layer 8 include PEDOT/PSS, PEDOT/NAFION (registered trademark), PEDOT/PVS, and the like; and preferably PEDOT/PSS. PEDOT is abbreviation of poly(3,4-ethylenedioxythiophene), PSS is abbreviation of poly(4-styrenesulfonate), and PVS is abbreviation of poly(vinyl sulfonic acid). Further, NAFION is a perfluorocarbon material having a sulfonic acid group.

Figure 8:
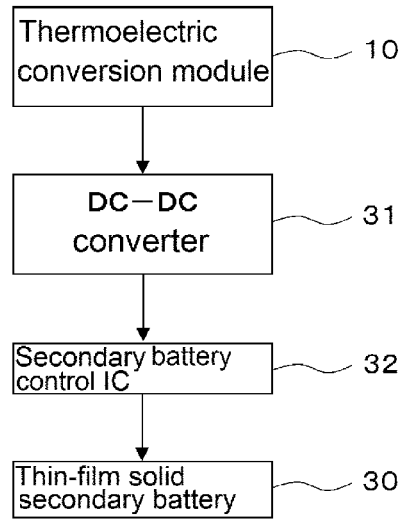
FIG. 8 is a block view showing a preferable example of the configuration for charging the thermoelectric generation module described in the embodiment.
Figure 9:
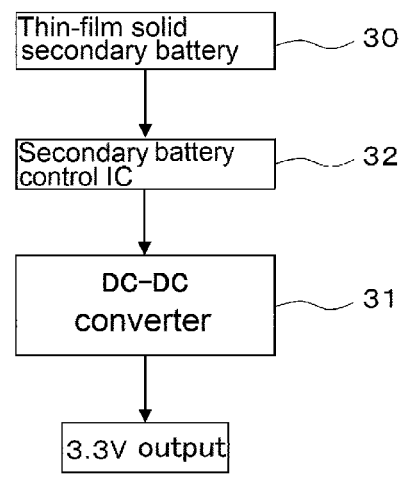
FIG. 9 is a block view showing a preferable example of the configuration for discharging the thermoelectric generation module described in the embodiment.

Next, an explanation is given about one preferable configuration example of charging and discharging of the thermoelectric generation module 10 mounting a thin-film solid secondary battery which is electrically connected to the output portion of the thermoelectric conversion layer 3, with reference to FIGS. 8 and 9.

As shown in FIG. 8, one preferable configuration example of charging is explained below.

The power generated by the thermoelectric generation module 10 is a direct-current power, and because of the low voltage, the power, as it is, is difficult to be used for a power required to drive an electronic devise, and the like. The voltage obtained by the thermoelectric generation module 10 is therefore increased by means of DC-DC converter 31. For example, the voltage is increased to 4.0 V.

Subsequently, the power with the increased voltage is charge to thin-film solid secondary battery as a secondary battery 30 via a secondary battery control IC 32 which controls charging and discharging of the secondary battery 30. The secondary battery control IC 32 is composed of: a charging power supply device which produces a direct-current power; and a charge control circuit which controls charging of the buttery, although these devices are not shown.

As shown in FIG. 9, a preferable example of the configuration of discharging is explained below.

The power discharged from the thin-film solid secondary battery as a secondary battery 30 via the secondary battery control IC 32 is transferred to the DC-DC converter 31. By the DC-DC converter 31, the voltage is converted to a voltage to be used for electronic devices (not shown) and then the resultant power is output. Ordinarily, the working voltage of the electronic devices is set to various voltages. The voltage is therefore dropped or increased to a working voltage suitable for the electronic devices by the DC-DC converter 31. For example, the voltage is transformed to 3.3 V, and then the power is output.

As for the DC-DC converter 31, use may be made, for example, of ETC310 manufactured by En Ocean GmbH; LTC3108 and LTC3109 each manufactured by Linear Technology, or the like.

As for the secondary battery control IC 32, use may be made, for example, of: LTC4070 and LTC4071 each manufactured by Linear Technology; MAX17710 manufactured by Maxim Integrated Products, or the like.

As for the thin-film solid secondary battery, use may be made, for example, of: MEC201 and MEC220 each manufactured by Infinite Power Solution, or the like.

Figure 10:
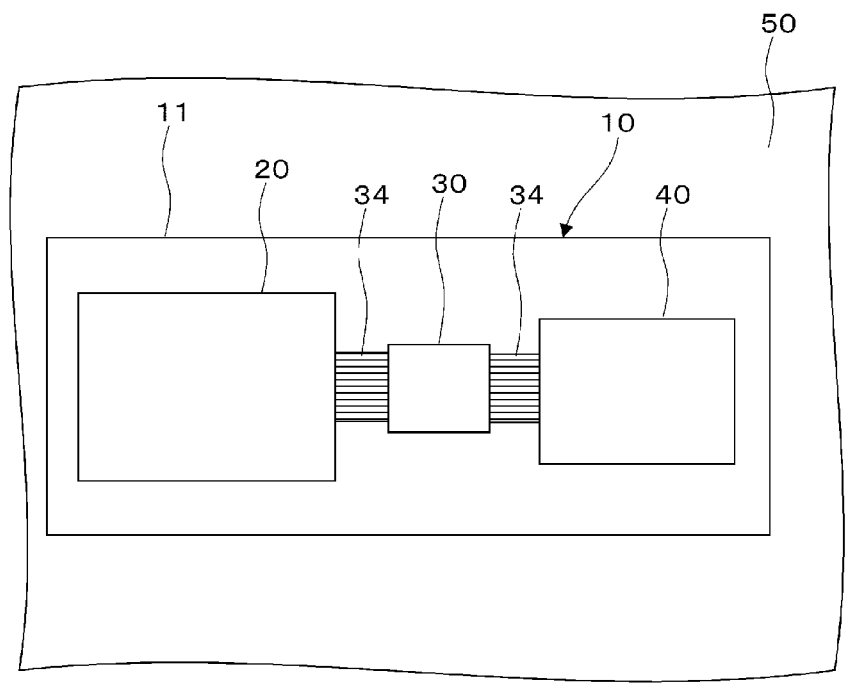
FIG. 10 is a plan view schematically showing a preferable example of the electronic device mounted on the thermoelectric generation module mounting a thin-film solid secondary battery.

Next, explanation is given about a thermoelectric generation module mounting a thin-film solid secondary battery as a secondary battery which is electrically connected to an output portion of the thermoelectric conversion layer, with reference to FIG. 10.

As shown in FIG. 10, in the thermoelectric generation module 10, a thermoelectric generator 20, a secondary battery 30 (for example, a thin-film solid secondary batter), and an electronic device 40 are connected with a cable 34 mounting a secondary battery control IC 32 (see FIGS. 8 and 9) or the like on a flexible base material 11. As for the cable 34, use is made of: FPC (flexible print circuit) cable; or FFC (flexible flat cable). Further, the thermoelectric generation module 10 is put on the heat generation source 50.

The secondary battery 30 may be mounted in the thermoelectric generator 20, although it is not shown.

Examples of the electronic device 40 include various kinds of electronic devices, such as: an electrocardiogram monitor device, a pulse monitor, a manometer, a wristwatch, a pedometer, a radio transmitting locational information, a thermometer, a vibration meter, or the like. The thermoelectric generation module 10 therefore can be preferably used for the intended purposes, such as a power supply for any of those electronic devices, or the like.

As to the production method of the thermoelectric generation module 10, it is just necessary that in a known production method of the thermoelectric generation module, the thermoelectric generation module 10 is formed by adhering the thermoelectric conversion layer 3 to the base material 1 in such a way that the thermoelectric conversion layer 3 is protruded over from the electrode 2.

The formation of the electrode 2 can be carried out, for example, by a plating method, a patterning method by etching, a sputtering method or an ion plating method using a liftoff process, a sputtering method or an ion plating method using a metal mask, or the like. Alternatively, use may be made of a metal paste, in which the above metal is subjected to microparticulation, and then a binder and a solvent are added thereto. In the case of using a metal paste, use may be made of: a screen printing method, or a printing method by a dispenser method. After printing, may be carried out: application of heating for drying; or a heating treatment for decomposition of the binder or sintering of the metal.

The formation of the thermoelectric conversion layer 3 is preferably carried out by a printing method, such as: a metal mask printing method of printing a carbon nanotube-dispersed paste; an ink jet printing method of printing by impacting ink droplets of an inkjet-coating liquid containing a carbon nanotube by ink jetting; a screen printing method, or the like.

Note that, as for the screen printing method, for example, there is a method of printing by preparing a printing plate from an etched metal mask, in addition to a method of printing by preparing a printing plate by subjecting a light-sensitive resin placed on a mesh made of ordinary stainless-steel, nylon, or polyester to a patterning exposure and then a development processing.

A detailed explanation about the metal mask printing method is given in Example section below.

The ink jet printing method is carried out as follows.

The total solid content concentration in a coating liquid for ink jetting is generally 0.05 mass % or more and 30 mass % or less, preferably 0.1 mass % or more and 20 mass % or less, and more preferably 0.1 mass % or more and 10 mass % or less.

The viscosity of the above coating liquid is, from the viewpoint of ejection stability, generally 1 mPa·s or more and 30 mPa·s or less, preferably 1.5 mPa·s or more and 20 mPa·s or less, and more preferably 1.5 mPa·s or more and 15 mPa·s or less.

The above coating liquid is used in such a way that the above ingredients are dissolved and dispersed in a prescribed organic solvent, to prepare a coating liquid, and the coating liquid is filtrated using a filter and then coated on the following prescribed support or layer. The filter for use in the filtration is preferably a poly(tetrafluoroethylene)-made, polyethylene-made, or nylon-made filter having a pore size of 2.0 μm or less, and more preferably 0.5 μm or less.

<Solvent>

In the coating liquid for ink jet printing, as a solvent (a coating solvent) for dissolving or compatibilizing an organic substance which acts as a thermoelectric material and a solvent for dispersing a conductive nanomaterial, it is possible to use a known solvent appropriately depending on the organic substance which acts as a thermoelectric material or the conductive nanomaterial.

Examples of the solvent include any of known organic solvents, such as an aromatic hydrocarbon solvent, an alcohol solvent, a ketone solvent, an aliphatic hydrocarbon solvent, an amide solvent, a halogenated solvent, and the like.

Examples of the aromatic hydrocarbon solvent include benzene, toluene, xylene, trimethylbenzene, tetramethylbenzene, cumene, ethylbenzene, methylpropylbenzene, methylisopropylbenzene, tetrahydronaphthalene, and the like. Of these solvents, xylene, cumene, trimethylbenzene, tetramethylbenzene, and tetrahydronaphthalene are more preferred.

Examples of the alcohol solvent include methanol, ethanol, butanol, benzyl alcohol, cyclohexnol, and the like. Of these solvents, benzyl alcohol and cyclohexnol are more preferred.

Examples of the ketone solvent include 1-octanone, 2-octanone, 1-nonanone, 2-nonanone, acetone, 4-heptanone, 1-hexanone, 2-hexanone, 2-butanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylene carbonate, and the like. Of these solvents, methyl isobutyl ketone and propylene carbonate are preferred.

Examples of the aliphatic hydrocarbon solvent include pentane, hexane, octane, decane, and the like. Of these solvents, octane and decane are preferred.

Examples of the amide solvent include N-metrhyl-2-pyrrolidone, N-etrhyl-2-pyrrolidone, N,N-dimethylacetoamide, N,N-dimethylformamide, 1,3-dimethyl-2-imidazolidinone, and the like. Of these solvents, N-metrhyl-2-pyrrolidone and 1,3-dimethyl-2-imidazolidinone are preferred.

Examples of the halogenated solvent include chloroform, chlorobenzene, dichlorobenzene, and the like. Of these solvents, chlorobenzene and dichlorobenzene are preferred.

The above solvents may be used solely, or used in combination of 2 kinds or more thereof.

<Bank>

Figure 11:
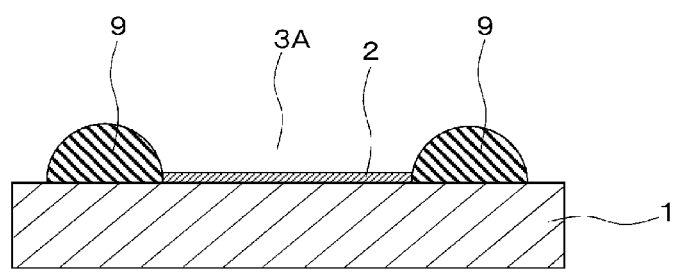
FIG. 11 is a cross-sectional view showing the base material to be used for ink jetting.

As shown in FIG. 11, as for the base material 1 for use in the ink jet printing method, it is preferred to employ a base material having bank 9 formed in such a way as to surround the outer periphery of the region 3a in which the thermoelectric conversion layer is formed. That is, the region 3a in which the thermoelectric conversion layer is formed, is entirely walled by the bank 9. Therefore, droplets of the coating liquid containing a thermoelectric conversion material which have been ink-jetted by ink jetting can be kept within the bank 9, whereby a formation of the thermoelectric conversion layer (not shown) having a certain height becomes possible.

Examples of the cross-sectional shape of the bank 9 include an arc shape (including a semi-circular shape, and a semi-elliptical shape), a triangular shape, a radial shape, a trapezoidal shape, and the like. It is preferred that the top of the bank 9 does not have a flat part. Therefore, the cross-sectional shape of the bank 9 is preferably a convex-curved shape of the arc shape, semi-elliptical shape, triangular shape, radial shape, and the like. By the embodiment in which the top of the bank 9 does not have a flat part, the droplets attached to the bank 9 become difficult to be kept on the top of the bank 9, thereby that they can move effectively to the region 3a in which the thermoelectric conversion layer is formed, by transferring along a convex-curved side surface of the bank 9. The shape of the bank 9 is more preferably an arc shape or a triangular shape, and more preferably an arc shape.

Examples of the material of the bank 9 include polyimide, a novolac-based resin, an epoxy resin, an acrylic resin, and the like, and from the viewpoint of liquid-repellent property and heat resistance, a polyimide is preferred. Note that the bank may be subjected to a liquid-repellent treatment, if needed. As to a specific method thereof, a fluorocarbon film may be formed on the bank 9 by chemical vapor deposition (CVD) using tetrafluorocarbon ($CF_4$) as a basic gas. Alternatively, a silane coupling agent having a long chain fluoroalkyl group, or a fluorine polymer may be mixed into the bank.

Examples of the formation method of the bank 9 include: a method of using a photosensitive resist including a dry resist, polyimide, or a photosensitive glass, and further patterning by UV light and development; a method of coating a resist on an alkali-developable polyimide so as to be a multi-layer, and then using patterning by UV light and development; a method of using patterning by a screen printing using an epoxy resin and a UV cross-linking.

The region 3a at which the thermoelectric conversion layer is formed, is a region which is surrounded by the bank 9, and a coating liquid containing an organic substance which acts as a thermoelectric material and a conductive nanomaterial are coated in this region 3a. Note that if needed, a layer may be formed by coating a coating liquid containing other organic substances, before or after coating the coating liquid onto the region 3a which forms the thermoelectric conversion layer.

The heating temperature and time period after coating is not particularly limited, as long as the coating liquid is dried. However, the heating temperature is generally 100° C. or more and 200° C. or less, and preferably 120° C. or more and 160° C. or less. The heating time period is generally 1 min or more and 120 min or less, preferably 1 min or more and 60 min or less, and more preferably 1 min or more and 25 min or less. Further, it is possible to use any of arbitrary methods, such as a method of drying in a low-pressure ambience, using a vacuum pump or the like; a method of drying by blowing, using a fan; a method of drying by feeding an inert gas (nitrogen, argon), and the like.

Note that a film formation may be carried out in such a way as to increase the thickness of the thermoelectric conversion layer by repeating a plurality of times of: ink-jet printing and drying by heating. Note that with regards to the drying by heating, it does not mutter whether a solvent component is completely volatilized or not.

EXAMPLES

The present invention will be described in more detail based on examples given below, but the invention is not meant to be limited by these.

Example 1

The thermoelectric conversion element of Example 1 was prepared below.

<Preparation of Carbon Nanotube Paste 1>

To 27 g of polystyrene having a polymerization degree of 2,000 (manufactured by Kanto Chemical), 3 g of silica fine-particles JA-244 (manufactured by Jujo Chemical Co., Ltd.) was added, and dispersed by a double roll mill heated at 180° C., thereby for preparing silica-dispersed polystyrene.

Then, to 25 mg of polyoctylthiophene (regio-random, manufactured by Sigma-Aldrich), 10 ml of tetrahydronaphthalene (manufactured by Kanto Chemical) was added, and by using an ultrasonic washer (US-2, output 120 W, indirect irradiation, manufactured by Iuchi Seieido), to prepare a polythiophene solution.

Then, to the polythiophene solution, 25 mg of KH SWCNT HP (manufactured by KH Chemicals, purity 80%) as a single layer carbon nanotube was added, and the mixture was subjected to ultrasonic dispersion using a mechanical homogenizer T10 basic ULTRA-TURRAX (trade name) manufactured by IKA Works, an ultrasonic homogenizer VC-750 (trade name) manufactured by Sonics & Materials Inc., and a tapered microchip (a probe diameter 6.5 mm), under the conditions of output 50 W, direct-irradiation, and a duty ratio 50%, at 30° C. for 30 min, thereby for preparing a carbon nanotube dispersion.

Then, to the carbon nanotube dispersion, 1.0 g of a PC-Z-type polycarbonate (PANLITE TS-2020 (trade name), manufactured by Teijin Chemicals) as a non-conjugated macromolecule and 1.0 g of the above-prepared silica-dispersed polystyrene were added, followed by being dissolved in a 50° C. hot bath. After that, the resultant mixture was stirred for 15 min at a rotation speed of 2,200 rpm using a planetary centrifugal mixer ARE-250 (trade name), manufactured by Thinky, thereby for preparing a carbon nanotube-dispersed paste 1.

<Preparation of Base Material>

A base material made of a poly(ethylene terephthalate) (PET) film was formed, according to the following procedures.

First, a PET resin having an intrinsic viscosity of 0.66 obtained by condensation polymerization using germanium (Ge) as a catalyst was dried to a moisture content of 50 ppm or less, and then the heater temperature was set to the range of 280° C. or more and 300° C. or less, and then the resultant dried resin was melted in an extruder. The thus-melted PET resin was ejected from a die portion onto a static electricity-applied chilled roll, thereby for obtaining an amorphous base. The thus-obtained amorphous base was stretched 3.3 times in the direction of the base travel, and then was stretched 3.8 times in the transverse direction, thereby for obtaining a base material made of 188 μm-thick PET film.

<Formation of Easy Adhesion Layer>

Each side of the thus-obtained 188 μm-thick base material was subjected to a corona discharge treatment, under the conditions of 730 J/m$^2$, while transporting the base material at a transportation speed of 105 m/min After that, the following first layer coating liquid was coated on each side of the base material by a bar coat method. Further, drying at 180° C. for 1 min, to form the first layers, and then continuously the following second layer coating liquid was coated in a coating amount of 96.25 mg/m$^2$ on each of the first layers by a bar coat method. After that, by drying at 170° C. for 1 min, a PET film was obtained, which has the first easy adhesion layer and the second easy adhesion layer, coated on each side of the base material.

(First Layer Coating Liquid)

Polyethylene methacrylic acid copolymer binder: 23.3 parts by mass
 (NUCREL N410, manufactured by Du Pont-Mitsui Polychemicals)
Colloidal silica: 15.4 parts by mass
 (SNOWTEC R503, manufactured by Nissan Chemical Industries, solid content 20 mass %)
Epoxy monomer: 221.8 parts by mass
 (DENACOL EX614B, manufactured by Nagase Chemtex, solid content 22 mass %)
Surfactant A: 19.5 parts by mass
 (1 mass % aq. solution of NAROACTY CL-95, manufactured by Sanyo Chemical)
Surfactant B: 7.7 parts by mass
 (1 mass % aq. solution of RAPISOL A-90, manufactured by NOF)
Distilled water: added so that the total reached 1,000 parts by mass (Second Layer Coating Liquid)

Polyurethane binder: 22.8 parts by mass (92.4 mass %)
 (Coating amount: 61.5 mg/m$^2$)
 (OLESTER UD-350, manufactured by Mitsui Chemicals, solid content of 38 mass %)
 (SP value: 10.0, I/O value: 5.5)
Acrylic binder: 2.6 parts by mass (7.6 mass %)
 (Coating amount: 5 mg/m$^2$)
 (EM48D, manufactured by Daicel, solid content 27.5 mass %)
 (SP value: 9.5, I/O value: 2.5)
Carbodiimide compound: 4.7 parts by mass (20 mass %)
 (Coating amount: 13.35 mg/m$^2$)
 (CARBODILITE V-02-L2, manufactured by Nisshinbo, solid content 40 mass %)
Surfactant A: 15.5 parts by mass (1.7 mass %)
 (Coating amount: 1.1 mg/m$^2$)
 (1 mass % aq. solution of NAROACTY CL-95, manufactured by Sanyo Chemical, nonionic property)
Surfactant B: 12.7 parts by mass (1.4 mass %)
 (Coating amount: 0.9 mg/m$^2$)
 (1 mass % aq. solution of RAPISOL A-90, manufactured by NOF, anionic property)
Fine-particles A: 3.5 parts by mass (15.1 mass %)
 (Coating amount: 10 mg/m$^2$)
 (SNOWTEX XL, manufactured by Nissan Chemical, solid content 40.5 mass %)
Fine-particles B: 1.6 parts by mass (1.7 mass %)
 (Coating amount: 1.1 mg/m$^2$)
 (AEROSIL OX-50 aqueous dispersion, manufactured by Nippon Aerosil, solid content 10 mass %)
Sliding agent: 1.6 parts by mass (5.1 mass %)
 (Coating amount: 3.3 mg/m$^2$)
 (Carnauba wax dispersion SEROSOL 524, manufactured by Chukyo Yushi, solid content of 30 mass %)
Distilled water: added so that the total reached 1,000 parts by mass <Preparation of Thermoelectric Conversion Element>

A 100 nm-thick chromium film and then a 200 nm-thick gold film were formed so as to be a respective layered film on an A6 size PET film in this order, by ion plating, through the use of a metal mask having portions of 6×9 mm opening formed by etching, thereby for forming an electrode.

Then, the above-prepared carbon nanotube-dispersed paste 1 was injected through a laser-processed metal mask having 80 portions of 8×9 mm opening and a thickness of 2 mm, followed by planarizing by a squeezee. At this time, in such the configuration as shown in FIG. 1, the carbon nanotube-dispersed paste 1 was printed on the electrode 2.

The PET film was dried by heating on an 80° C. hot plate, thereby for forming a thermoelectric conversion element on the electrode.

Example 2

The thermoelectric conversion element of Example 2 was prepared below.

<Formation of Easy Adhesion Layer>

Each side of the 188 μm-thick PET-film base material prepared in the same manner as in Example 1 was subjected to a corona discharge treatment, under the conditions of 730 J/m$^2$, while transporting the base material at a transportation speed of 80 m/min After that, an easy adhesion layer coating liquid having the following formula was coated in a coating amount of 4.4 cm$^3$/m$^2$ on each side of the base material by a bar coat method. Further, drying at 160° C. for 1 min, to form an easy adhesion layer, and thereby that a PET film having the easy adhesion layer coated on each side of the base material was obtained.

(Formula of Coating Liquid for Easy Adhesion Layer)

Urethane resin binder: 30.7 parts by mass
 (Coating amount: 55 mg/m$^2$)
 (OLESTER UD-350, manufactured by Mitsui Chemicals, solid content of 38 mass %)
 (SP value: 10, I/O value: 5.5, glass transition temperature: 33° C.)
Acrylic resin binder: 4.2 parts by mass
 (Coating amount: 4.5 mg/m$^2$)
 (AS563, manufactured by Daicel Fine Chem., solid content 27.5 mass %)
 (SP value: 9.5, I/O value: 2.5, glass transition temperature: 47° C.)
Cross-linking agent: 5.8 parts by mass
 (Coating amount: 8 mg/m$^2$)
 (CARBODILITE V-02-L2, manufactured by Nisshinbo, solid content 40 mass %)
Additive (fine-particles (filler)): 1.9 parts by mass
 (Coating amount: 1 mg/m$^2$)
 (AEROSIL OX-50, manufactured by Nippon Aerosil, solid content 10 mass %)
Additive (fine-particles (filler)): 0.8 parts by mass
 (Coating amount: 2 mg/m$^2$)
 (SNOWTEX XL, manufactured by Nissan Chemical, solid content 40 mass %)

Additive (sliding agent): 1.9 parts by mass
(Coating amount: 3 mg/m$^2$)
(SEROSOL 524, manufactured by Chukyo Yushi, solid content of 30 mass %)
Surfactant 1: 15.5 parts by mass
(Coating amount: 0.1 mg/m$^2$)
(1 mass % aq. solution of RAPISOL A-90, manufactured by NOF, anionic property)
Surfactant 2: 19.4 parts by mass
(Coating amount: 0.1 mg/m$^2$)
(1 mass % aq. solution of NAROACTY CL-95, manufactured by Sanyo Chemical, nonionic property)
Distilled water: added so that the total reached 1,000 parts by mass <Preparation of Thermoelectric Conversion Element>

A thermoelectric conversion element was prepared in the same manner as in Example 1, except that the PET film formed by coating the easy adhesion layer on each side of the base material was used, in place of the PET film on which the two easy adhesion layers were formed on each side of the base material as in Example 1.

Example 3

<Preparation of Thermoelectric Conversion Element>

The thermoelectric conversion element of Example 3 was prepared below.

On an 188 μm-thick PET film base material prepared in the same manner as in Example 1, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

Then, a surface treatment was carried out, using an atmospheric plasma surface treatment apparatus AP-T02-L120 (manufactured by Sekisui Kagaku), under the conditions of: processing gas nitrogen, gas flow rate 60 L/min, processing speed 2 L/min, applied voltage 155 V, and electric current 1.42 A.

After the above, the thermoelectric conversion element was prepared in the same manner as in Example 1.

Example 4

<Preparation of Thermoelectric Conversion Element>

The thermoelectric conversion element of Example 4 was prepared below.

The thermoelectric conversion element was prepared in the same manner as in Example 3, except that a 125 μm-thick polyimide film: CAPTON 500V (manufactured by DuPont Toray) was used as a base material, and a UV ozone apparatus: UVO Cleaner 42 (trade name, manufactured by Jelight Company, Inc.) was used in place of the atmospheric plasma surface treatment apparatus, and that a UV-ozone treatment was carried out for 10 min in terms of irradiation time.

Example 5

<Preparation of Thermoelectric Conversion Element>

The thermoelectric conversion element of Example 5 was prepared below.

The thermoelectric conversion element was prepared in the same manner as in Example 3, except that the PET film, on which the two easy adhesion layers were formed by coating in the same manner as Example 1, was used as a base material, and that a surface modification treatment was carried out twice, under the conditions of: electrode output 80 W and moving speed of the electrode 1 m/min, using a corona surface-modification apparatus TEC-4AX (manufactured by Kasuga Electric Works), in place of the atmospheric plasma surface treatment apparatus.

Example 6

The thermoelectric conversion element of Example 6 was prepared below.

<Preparation of Liquid>

For a conductive resin layer (undercoat layer), 90 parts by mass of PEDOT/PSS dispersion liquid: CLEVIOS P VP8000 (manufactured by Heraeus, product name) and 10 parts by mass of isopropyl alcohol (manufactured by Kanto Chemical) were mixed and stirred for 1 hour using a mix rotor: MR-3 (manufactured by AS ONE). After stirring, a filtration treatment was carried out with a PVDF-made mesh having a 70 μm sieve opening, thereby for preparing the PEDOT/PSS dispersion liquid.

<Preparation of Base Material>

On a PET film base material prepared on which the two easy adhesion layers were formed by coating on each side of the base material in the same manner as in Example 1, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

Then, the above-prepared PEDOT/PSS dispersion liquid was coated on the above base material having the electrode formed thereon, using an automatic coater: PI-1210 (manufactured by Tester Sangyo) and a bar coater ROD No. 4, under the condition of 50 mm/sec in terms of coating speed.

After coating, the coated substance was dried on an 80° C. hot plate for 5 min, and then was dried for 1 hour in a vacuum dryer having an atmospheric pressure of 0.2 kPa or less and a 80° C. internal temperature of the dryer, thereby for forming the PET film base material having the conductive resin layer formed thereon as an undercoat layer.

<Preparation of Thermoelectric Conversion Element>

The thermoelectric conversion element was prepared in the same manner as in Example 1, except that the PET film base material having the conductive resin layer formed thereon was used as a base material.

Example 7

The thermoelectric conversion element of Example 7 was prepared as follows.

The thermoelectric conversion element was prepared in the same manner as in Example 1, except that a PEN film TEONEX Q51DW (Teijin DuPont's trade name) on which a 50 μm-thick easy adhesion layer was formed by coating, was used as a base material.

Example 8

The thermoelectric conversion element of Example 8 was prepared as follows.

<Preparation of Base Material>

As a base material, a 125 μm-thick polyimide film: CAPTON 500V (manufactured by DuPont Toray) was used, and the base material was subjected to a blast treatment, using a wet blast device WFB-2-2 (manufactured by Macoho), under the conditions of: alumina grinding stone (granularity 800) as an abrasive, hydraulic pressure of 0.7 kg/m², and blast speed of 10 m/min, thereby for preparing the roughened polyimide base material.
<Preparation of Thermoelectric Conversion Element>

The thermoelectric conversion element was prepared in the same manner as in Example 1, except that the roughened polyimide base material was used as a base material.

Example 9

The thermoelectric conversion element of Example 9 was prepared as follows.

On an 188 μm-thick PET film base material prepared in the same manner as in Example 1, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

After the above, the thermoelectric conversion element was prepared in the same manner as in Example 1.

Example 10

The thermoelectric conversion element of Example 10 was prepared as follows.

On a 125 μm-thick polyimide film base material: CAPTON 500V (manufactured by DuPont Toray), a 100 nm-thick chromium film and a 200 nm-thick gold film were formed so as to be a respective layered film in this order, by ion plating, through the use of a metal mask having portions of 6×9 mm opening formed by etching, thereby for forming an electrode.

After the above, the thermoelectric conversion element was prepared in the same manner as in Example 1.

Example 11

The thermoelectric conversion element of Example 11 was prepared as follows.

The formation of the base material and the easy adhesion layer, and the preparations of the thermoelectric conversion element were carried out in the same manner as in Example 1, except that carbon nanotube-dispersed paste 2 was used in place of the carbon nanotube-dispersed paste 1.
<Preparation of Carbon Nanotube Paste 2>

The carbon nanotube-dispersed paste 2 was prepared in the same manner as preparation of the carbon nanotube-dispersed paste 1, except that, as a non-conjugated macromolecule, poly(1-vinylnaphthalene) (191165 (product code), manufactured by Sigma-Aldrich) was used in place of the PC-Z-type polycarbonate (PAN LITE TS-2020 (trade name), manufactured by Teijin Chemicals).

Example 12

The thermoelectric conversion element of Example 12 was prepared as follows.

The formation of the base material and the easy adhesion layer, and the preparations of the thermoelectric conversion element were carried out in the same manner as in Example 1, except that carbon nanotube-dispersed paste 3 was used in place of the carbon nanotube-dispersed paste 1.
<Preparation of Carbon Nanotube Paste 3>

The carbon nanotube-dispersed paste 3 was prepared in the same manner as preparation of the carbon nanotube-dispersed paste 1, except that, as a non-conjugated macromolecule, poly(methyl methacrylate) (200365 (product code), manufactured by Sigma-Aldrich) was used in place of the PC-Z-type polycarbonate (PANLITE TS-2020 (trade name), manufactured by Teijin Chemicals).

Example 21

The thermoelectric conversion element of Example 21 was prepared as follows.

The formation of the base material and the easy adhesion layer, and the preparations of the thermoelectric conversion element were carried out in the same manner as in Example 1, except that carbon nanotube-dispersed paste 4 was used in place of the carbon nanotube-dispersed paste 1.
<Preparation of Carbon Nanotube Paste 4>

The carbon nanotube-dispersed paste 4 was prepared in the same manner as preparation of the carbon nanotube-dispersed paste 1, except that, as a non-conjugated macromolecule, poly(benzyl methacrylate) (181350 (product code), manufactured by Sigma-Aldrich) was used in place of the PC-Z-type polycarbonate (PANLITE TS-2020 (trade name), manufactured by Teijin Chemicals).
<Preparation of Thermoelectric Conversion Element>

On an A6 size PET film, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

Then, the above-prepared carbon nanotube-dispersed paste 4 was injected, through a laser-processed metal mask having 80 portions of 8×9 mm opening and a thickness of 2 mm, followed by planarizing by a squeezee. At this time, in such the configuration as shown in FIG. 1, the carbon nanotube-dispersed paste 4 was printed on the electrode 2.

Figure 13:
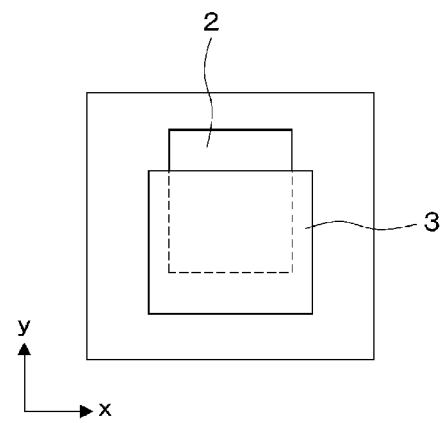
FIG. 13 is a plan view showing a position relationship between the electrode and the thermoelectric conversion layer in Examples 21 to 23.

The PET film was dried by heating on an 80° C. hot plate, thereby for forming a thermoelectric conversion element on the electrode. At this time, as shown in FIG. 13, the thermoelectric conversion layer 3 was printed in such a manner that 3 sides of the thermoelectric conversion layer around the electrode 2 protruded into one of Y-directions and both of X-directions.
<Preparation of Thermoelectric Generation Module>

Eighty thermoelectric conversion elements were wired in series by coating thereon a silver paste: FA-333 (manufactured by Fujikura Kasei), followed by drying for 1 hour on an 80° C. hot plate, thereby for preparing a thermoelectric generation module 10.

Then, 4 g of poly(vinylpyrrolidone) K-30 (manufactured by Tokyo Chemical Industry) was dissolved in 96 g of a mixed solvent of pure water/isopropyl alcohol (volume ratio: 80:20), followed by a filtration treatment with a PVDF-made mesh having a 70 μm sieve opening, thereby for preparing a polymer solution for overcoat. Then, the polymer solution was coated thereto so that the film thickness after drying would be 20 nm, using a spray coating device STS-200 (manufactured by YD Mechatro Solutions) and using a nitrogen gas as a carrier gas. After coating, the coated substance was dried on a 50° C. hot plate, and then was vacuum-dried for 2 hours in a vacuum dryer ADP200 (manufactured by Yamato Scientific), at vacuum of 0.2 kPa or less and temperature of 50° C., thereby for preparing the thermoelectric generation module 10 of Example 21.

Example 22

The thermoelectric generation module 10 of Example 22 was prepared in the same manner as in Example 21, except that the above-prepared carbon nanotube-dispersed paste 4 was injected, through a laser-processed metal mask having 80 portions of 8×7.7 mm opening and a thickness of 2 mm, followed by planarizing by a squeezee.

At this time as shown in FIG. 13, the thermoelectric conversion layer 3 was printed in such a manner that 3 sides of the thermoelectric conversion layer around the electrode 2 protruded into one of Y-directions and both of X-directions.

Example 23

The thermoelectric generation module 10 of Example 23 was prepared in the same manner as in Example 21, except that the above-prepared carbon nanotube-dispersed paste 4 was injected, through a laser-processed metal mask having 80 portions of 8×8 mm opening and a thickness of 2 mm, followed by planarizing by a squeezee.

At this time as shown in FIG. 13, the thermoelectric conversion layer 3 was printed in such a manner that 3 sides of the thermoelectric conversion layer around the electrode 2 protruded into one of Y-directions and both of X-directions.

Example 24

The thermoelectric generation module 10 of Example 24 was prepared in the same manner as in Example 21, except that the above-prepared carbon nanotube-dispersed paste 4 was injected, through a laser-processed metal mask having 80 portions of 6×9 mm opening and a thickness of 2 mm, followed by planarizing by a squeezee.

Figure 14:
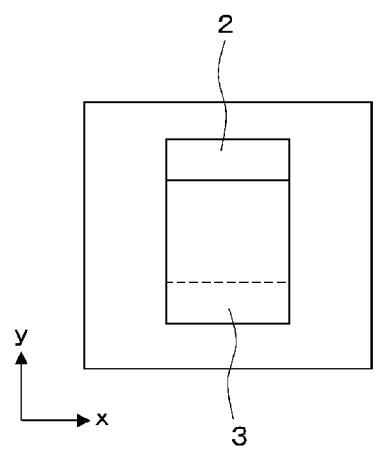
FIG. 14 is a plan view showing a position relationship between the electrode and the thermoelectric conversion layer in Example 24.

At this time as shown in FIG. 14, the thermoelectric conversion layer 3 was printed in such a manner that 1 side of the thermoelectric conversion layer around the electrode 2 protruded into only one of Y-directions.

Example 25

The thermoelectric generation module 10 of Example 25 was prepared in the same manner as in Example 21, except that the above-prepared carbon nanotube-dispersed paste 4 was injected, through a laser-processed metal mask having 80 portions of 8×7.5 mm opening and a thickness of 2 mm, followed by planarizing by a squeezee.

Figure 15:
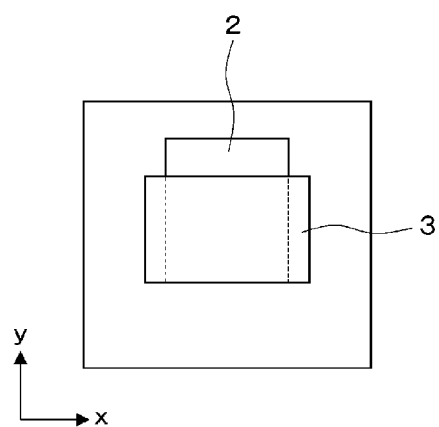
FIG. 15 is a plan view showing a position relationship between the electrode and the thermoelectric conversion layer in Example 25.

At this time as shown in FIG. 15, the thermoelectric conversion layer 3 was printed in such a manner that 2 sides of the thermoelectric conversion layer around the electrode 2 protruded into both of X-directions.

Comparative Example 1

The thermoelectric conversion element of Comparative Example 1 was prepared as follows.
<Preparation of Thermoelectric Conversion Element>
On the PET film base material prepared in the same manner as in Example 1, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

Then, without subjecting the PET film with the electrode to any surface treatment in particular, the above-prepared carbon nanotube-dispersed paste was injected thereto, through a laser-processed metal mask having 80 portions of 8×7.5 mm opening and a thickness of 2 mm, followed by planarizing by a squeezee. At this time, the carbon nanotube-dispersed paste was printed only on the electrode. The resultant base material was dried by heating on an 80° C. hot plate, thereby for forming a thermoelectric conversion element.

Comparative Example 2

The thermoelectric conversion element of Comparative Example 2 was prepared as follows.

The thermoelectric conversion element was prepared in the same manner as in Comparative Example 1, except that, on the PET film with the electrode, using a UV ozone apparatus: UVO Cleaner 42 (trade name, manufactured by Jelight Company, Inc.), a UV-ozone treatment was carried out for 10 min in terms of irradiation time.

Comparative Example 3

The thermoelectric conversion element of Comparative Example 3 was prepared as follows.

On the PET film base material prepared, on which the easy adhesion layers were formed by coating in the same manner as in Example 1, a 100 nm-thick chromium film and a 200 nm-thick gold film were formed so as to be a respective layered film in this order, by ion plating, through the use of a metal mask having portions of 6×9 mm opening formed by etching, thereby for forming an electrode.

Then, without subjecting the PET film with the electrode to any surface treatment in particular, the above-prepared carbon nanotube-dispersed paste was injected thereto, through a laser-processed metal mask having 80 portions of 8×7.5 mm opening and a thickness of 2 mm, followed by planarizing by a squeezee. At this time, the carbon nanotube-dispersed paste was printed only on the electrode. The resultant base material was dried by heating on an 80° C. hot plate, thereby for preparing a thermoelectric conversion element.

Comparative Example 21

The thermoelectric generation module of Comparative Example 21 was prepared in the same manner as in Example 21, except that the above-prepared carbon nanotube-dispersed paste 4 was injected, through a laser-processed metal mask having 80 portions of 6×7.5 mm opening and a thickness of 2 mm, followed by planarizing by a squeezee.

At this time, the thermoelectric conversion layer was printed, without protruding into around the electrode.
(Evaluation of Thermoelectric Conversion Elements)
Evaluation of the thus-prepared thermoelectric conversion elements was carried out as follows.
<Tape-Peeling-Off Test>
Scotch-tape (registered trademark) (width 12 mm) CT-12 (manufactured by Nichiban) was adhered to the formed thermoelectric conversion layer. At the time of peeling-off, the tape was peeled-off so that an angle of the tape with respect to the substrate would be 135 degree, and the shape of the thermoelectric conversion layer was determined on the basis of the following criteria.

The case where the thermoelectric conversion layer is not at all peeled-off, is represented by "A" as being excellent in peeling-off resistance, The case where the thermoelectric conversion layer is partially peeled-off, is represented by "C" as being usable in view of practical peeling-off resistance, and The case where the thermoelectric conversion layer is completely peeled-off, is represented by "D" as being poor in peeling-off resistance.

<Resistance to Heating and Bending Test>

Every eight thermoelectric conversion layers each were connected with a wire formed by coating thereon a silver paste: FA-333 (manufactured by Fujikura Kasei) and drying it for 1 hour on an 80° C. hot plate. Thus, 10 lines of the thermoelectric conversion modules were prepared. The resistance value of each of the lines was measured by a tester, and the ratio of resistance values before and after the heating and bending resistance test was calculated. Further, whether any peeling-off was occurred or not, was confirmed with the naked eyes.

Note that, in the resistance to heating and bending test, a 60 W incandescent lamp was lightened at the center portion of the ABS resin pipe having an outside diameter of ϕ35 mm and an inside diameter of ϕ25 mm. At this time, an ambient temperature was 25° C. and a surface temperature of the pipe was 45° C. A process of winding the thermoelectric conversion module around this pipe and maintaining it for 3 min was repeated 5 times, and then measurement of the resistance value and evaluation with the naked eyes were carried out. The rate of change of resistance and increase rate of resistance were defined as an average of the 10 lines.

Rate of change of resistance (increase rate)={(Resistance value after resistance test)−(Resistance value before resistance test)}/(Resistance value before resistance test)×100

The rate of change of resistance was determined by the following criteria.

The case where the rate of change of resistance is within ±2% and the thermoelectric conversion layer is not at all peeled-off, is represented by "A" as being excellent in heating and bending resistance, The case where the rate of change of resistance is 2% or more and less than 10% and the thermoelectric conversion layer is not at all peeled-off, is represented by "B" as having good heating and bending resistance, The case where the rate of change of resistance is 10% or more but cracking was occurred in the thermoelectric conversion layer, is represented by "C" as being usable in view of practical heating and bending resistance, and The case where measurement of resistance is impossible and peeling-off was occurred in the thermoelectric conversion layer, is represented by "D" as being poor in heating and bending resistance.

<Leakage Test>

Figure 12:
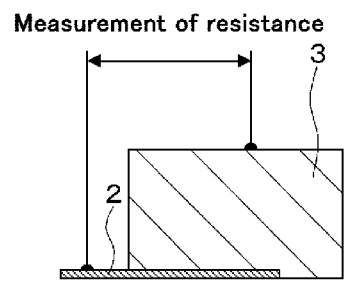
FIG. 12(a) and FIG. 12(b) each are a cross-sectional view showing a resistance measuring method.
Figure 12:
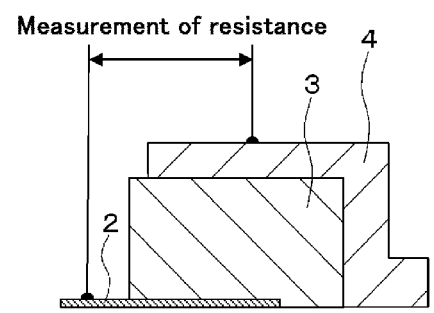

Occurrence of leakage was evaluated, by comparing a resistance value A of electrode 2 (gold electrode)-thermoelectric conversion layer 3, as shown in FIG. 12(1), which was measured by a tester after printing and drying the thermoelectric conversion layer on the gold electrode, to a resistance value B of electrode (gold electrode)-thermoelectric conversion layer 3-wiring 4 (silver electrode), which was measured after coating further thereon a silver paste: FA-333 (manufactured by Fujikura Kasei) and drying it for 1 hour on an 80° C. hot plate. The rate of change of the resistance was calculated by the following formula, and was defined as an average of 80 thermoelectric conversion elements.

Rate of change of resistance=Resistance value $A$)−(Resistance value $B$)/(Resistance value $A$)×100

The leakage was determined by the following criteria.

The case where the rate of change of resistance is 100% or more means non-leakage, is represented by "A" as being excellent in leakage, The case where the rate of change of resistance is 90% or more, although there is leakage occurrence, is represented by "C" as being usable in practice, and The case where the rate of change of resistance is less than 90%, is represented by "D" as being poor because of leakage.

(Evaluation of Thermoelectric Generation Module)

Evaluation of the above-prepared thermoelectric generation module was carried out as follows.

<Measurement of Protruded Width of Thermoelectric Conversion Layer>

The backing side of the PET was observed and measured by a measuring microscope MM400/LU (manufactured by Nikon), and the shortest length ranging from one end of the electrode to the other end of the thermoelectric conversion layer was defined as a width of the thermoelectric conversion layer protruded into around the electrode.

<Measurement of Thickness of Thermoelectric Conversion Layer>

The height ranging from the gold electrode to the top of the thermoelectric conversion layer was measured, using a laser microscope VK-X200 (manufactured by KEYENCE) and the thus-measured value was defined as the thickness of the thermoelectric conversion layer.

<Measurement of Thermal Electromotive Voltage of Thermoelectric Generation Module>

The thermoelectric generation module was placed so that the PET substrate and a stainless-steel have contact with one another, on a water-cooling heat sink P-200S (manufactured by Takagi Mfg.).

Then, a heater plate HU-600C (manufactured by Takagi Mfg.) was placed so as to be brought into contact with the thermoelectric conversion layer.

Under the conditions that the temperature of the water-cooling heat sink is regulated so that the temperature of the PET substrate would be kept at 20° C. and that the heater plate would be maintained at 50° C., a voltage generated at both ends of 80 thermoelectric conversion elements in series is measured, using a digital multi-meter R6871E (manufactured by Advantest). The voltage value measured in this manner was defined as a thermal electromotive voltage of the thermoelectric generation module.

The results of evaluation of the thermoelectric conversion elements are shown in Tables 1 to 4, and the results of evaluation of the thermoelectric generation modules are shown in Table 5.

TABLE 1

| Example | Base material | Treatment | Tape peeling-off test | Resistance to heating and bending test | Rate of change of resistance |
|---|---|---|---|---|---|
| 1 | Un-treated PET (188 μm-thick) | Easy adhesion layers (urethane/acrylic layers) | A | A | A |

TABLE 1-continued

| Example | Base material | Treatment | Tape peeling-off test | Resistance to heating and bending test | Rate of change of resistance |
|---|---|---|---|---|---|
| 2 | Un-treated PET (188 μm-thick) | Easy adhesion layer (acrylic layer) | A | A | A |
| 3 | Un-treated PET (188 μm-thick) | Atmospheric plasma treatment | A | B | A |
| 4 | Polyimide (125 μm-thick) | UV ozone treatment | A | A | A |
| 5 | Easy adhesion layer-formed PET (urethane/acrylic layers) | Corona treatment | A | A | A |
| 6 | Easy adhesion layer-formed PET (urethane/acrylic layers) | PEDOT/PSS | A | B | A |
| 7 | Easy adhesion layer-formed PEN | — | A | A | A |
| 8 | Polyimide (125 μm-thick) | Sand-blast treatment | A | B | A |
| 9 | Un-treated PET (188 μm-thick) | — | C | C | A |
| 10 | Polyimide (125 μm-thick) | — | C | C | A |

TABLE 2

| Example | Non-conjugated macromolecule | Base material | Treatment | Tape peeling-off test | Resistance to heating and bending test | Rate of change of resistance |
|---|---|---|---|---|---|---|
| 11 | Poly(1-vinyl-naphthalene) | Un-treated PET (188 μm-thick) | Easy adhesion layer | A | B | A |
| 12 | Poly(methyl methacrylate) | Un-treated PET (188 μm-thick) | Easy adhesion layer | A | A | A |

TABLE 3

| Comparative example | Base material | Treatment | Tape peeling-off test | Resistance to heating and bending test | Rate of change of resistance |
|---|---|---|---|---|---|
| 1 | Un-treated PET (188 μm-thick) | Thermoelectric conversion layer was formed only on the electrode | D | D | D |
| 2 | UV ozone treated-PET (188 μm-thick) | Thermoelectric conversion layer was formed only on the electrode | D | D | D |
| 3 | Easy adhesion layer formed-PET (urethane/acrylic layers) | Thermoelectric conversion layer was formed only on the electrode | D | D | D |

TABLE 4

| | Protruded direction | Tape peeling-off test | Resistance to heating and bending test | Rate of change of resistance |
|---|---|---|---|---|
| Ex. 21 | 3 sides | A | A | A |
| Ex. 22 | 3 sides | A | A | A |
| Ex. 23 | 3 sides | A | B | A |
| Ex. 24 | 1 side | C | B | A |
| Ex. 25 | 2 sides | A | B | C |
| Comp. ex. 21 | None | D | D | D |

Note:
"Ex." means Example according to this invention;
"Comp. ex." means Comparative Example (hereinbelow the same will be applied to)

TABLE 5

| | Protruded width wiring direction | Protruded width electrode side | Thickness | Thermal electromotive force (relative value) |
|---|---|---|---|---|
| Ex. 21 | 1.8 mm | 0.65 mm | 300 μm | 1.8 |
| Ex. 22 | 0.67 mm | 0.64 mm | 310 μm | 1.5 |
| Ex. 23 | 0.23 mm | 0.66 mm | 310 μm | 1.4 |
| Ex. 24 | 1.78 mm | — | 300 μm | 1.7 |
| Ex. 25 | — | 0.62 mm | 310 μm | 1.2 |
| Comp. ex. 21 | — | — | 310 μm | 1.0 |

From the results of evaluation in Examples 1 to 10, it has become evident that adhesion property between the thermoelectric conversion layer and the base material are improved by the present invention, and that the thermoelectric conversion layer exerts a good performance in the tape-peeling-off test and the heating and bending resistance test. In particular, it is said that, in the embodiment in which the easy adhesion layer is formed on the PET or PEN film base material, the adhesion property of the thermoelectric conversion layer has been gotten better, as a result of maintenance of the condition in which a wetting property is improved due to the easy adhesion layer. Further, it is said that, the embodiment in which a UV-ozone treatment has been applied to the polyimide substrate, exhibited more excellent heating and bending resistance, for the reasons that, in associated with the surface treatment, an imide ring is ring-opened, and the condition in which a wetting property has been improved is maintained, and a thermal expansion rate of the base material is low.

Further, when the thermoelectric conversion layer was formed by printing a carbon nanotube-dispersed paste so that the thermoelectric conversion layer was adhered to the base material outward three sides of the electrode (gold electrode), a good rate of change of resistance was obtained.

On the other hand, from the results of evaluation in terms of rate of change of resistance in Example 24, it has become evident that, in the lower side of the wiring to be connected, if the thermoelectric conversion layer is protruded from only one side of the electrode and is adhered to the base material, no leakage is occurred, which results in an excellent performance. Further, from the results of evaluation in terms of rate of change of resistance in Example 25, it has become evident that even if the thermoelectric conversion layer is protruded from two sides of the electrode in the direction other than the wiring direction and is adhered to the base material, the leakage was in such a condition as to be usable in practice.

Further, from the results of evaluation in Examples 11 and 12, it has become evident that even if a vinyl polymer or a (meth)acrylic polymer is used as a non-conjugated macromolecule, the adhesion property between the thermoelectric conversion layer and the base material are improved by adopting the configuration of the present invention, and the thermoelectric conversion layer exerts a good performance in the tape-peeling-off test and the heating and bending resistance test. Further, it has become evident that a (meth) acrylic polymer or a carbonate exerts more excellent performance than a vinyl polymer, in the heating and bending resistance test.

It has become evident that, compared to Comparative Example 21, Examples 21 to 25 according to the present invention are improved in terms of adhesion to the base material and exhibit a good performance in the tape-peeling-off test and the heating and bending resistance test. Further, as the number of protrusion directions of the thermoelectric conversion layer 3 onto the base material 1, namely the adhesion area becomes larger, the results in the tape-peeling-off test and the heating and bending resistance test become better in particular.

Further, from the results of evaluation of the thermoelectric generation module in Examples 21 to 24, it has become evident that a good thermal electromotive force is obtained, a high thermal electromotive force is obtained by protrusion of the silver paste wiring to the wiring direction, and a higher thermal electromotive force is obtained by enlarging the protruding width thereof.

From Examples 21, 22 and 23, it has become evident that it is effective to make the protruding width larger than the film thickness of the thermoelectric conversion layer 3, in order to balance the thermoelectric conversion element which is excellent in the tape-peeling-off test and the heating and bending resistance test with the thermoelectric generation module which exhibits a large thermal electromotive force.

In Comparative Examples 1, 2, and 3, as to the thermoelectric conversion element having a thermoelectric conversion layer formed only on the electrode (gold electrode), a peeling-off between the electrode and the thermoelectric conversion element occurred in the tape-peeling-off test and the heating and bending resistance test. It is presumed to be due to a weak interaction between the electrode and a binder of the thermoelectric conversion layer, which results in a low adhesion property. Further, in contrast to a surface treatment to an organic substance such as a film, there is no hydroxyl group or carboxylic acid group introduced into the electrode, and therefore a surface treatment to the electrode has no effect except for cleaning. In view of the above, it is expected that no adhesion property is improved any more. Further, a change of resistance was caused by leakage between the electrode and the wiring (gold electrode-silver paste), due to an inadequate coating of the end surface of the electrode.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Base material
2 Electrode
2a Portion to which a wiring is to be connected
3 Thermoelectric conversion layer
3a Region in which a thermoelectric conversion layer is to be formed
4 Wiring
5 Thermoelectric conversion element
6 Easy adhesion layer
7 Surface-modified layer
8 Conductive resin layer
9 Bank
10 Thermoelectric generation module
11 Flexible base material
20 Thermoelectric generator
30 Secondary battery
31 DC-DC converter
32 Secondary battery control IC
34 Cable
40 Electronic device
50 Heat source

The invention claimed is:

1. A thermoelectric generation module having:
resin film;
a plurality of electrodes disposed on the resin film; and
a thermoelectric conversion layer having a resin layer that coats each of the electrodes individually leaving a portion of the electrode to which a wiring is to be connected,
wherein the thermoelectric conversion layer having a resin layer adheres to the resin film around three sides of the electrode coated by the thermoelectric conversion layer having a resin layer excluding the portion of the electrode to which the wiring is to be connected, and
wherein the thermoelectric conversion layer having a resin layer protrudes around the electrode in three directions.

2. The thermoelectric generation module as claimed in claim 1, wherein the thermoelectric conversion layer having a resin layer adheres to the resin film around three sides of the electrode below the wiring that is connected to the thermoelectric conversion layer having a resin layer.

3. The thermoelectric generation module as claimed in claim 2, wherein a width of an adhered portion of the thermoelectric conversion layer having a resin layer and the resin film is wider than a thickness of the thermoelectric conversion layer.

4. The thermoelectric generation module as claimed in claim 1, wherein an easy adhesion layer lies between at least the resin film and the thermoelectric conversion layer having a resin layer, and wherein the thermoelectric conversion layer having a resin layer adheres, via the easy adhesion layer as an adhesion layer, to the resin film around three sides of the electrode excluding the portion of the electrode to which the wiring is to be connected.

5. The thermoelectric generation module as claimed in claim 1, wherein a conductive resin layer lies between at least the resin film and the electrode and the thermoelectric conversion layer having a resin layer, and wherein the thermoelectric conversion layer having a resin layer adheres, via the conductive resin layer as an adhesion layer, to the resin film of the electrode and around three sides of the electrode excluding the portion of the electrode to which the wiring is to be connected.

6. The thermoelectric generation module as claimed in claim 5, wherein electric conductivity of the thermoelectric conversion layer having a resin layer is higher than the conductive resin layer.

7. The thermoelectric generation module as claimed in claim 1, wherein a background surface of the thermoelectric conversion layer having a resin layer, that is the side of at least the thermoelectric conversion layer having a resin layer to be adhered, has an energy ray-irradiated surface-modified face, and wherein with the use of the surface-modified face as an adhesion surface, the thermoelectric conversion layer having a resin layer adheres to the resin film around three sides of the electrode excluding the portion of the electrode to which the wiring is to be connected.

8. The thermoelectric generation module as claimed in claim 1, wherein the wiring electrically connects the thermoelectric conversion layer having a resin layer with a portion of an other electrode to which the wiring is to be connected, wherein the other electrode is adjacent to the electrode coated by the thermoelectric conversion layer having a resin layer.

9. The thermoelectric generation module as claimed in claim 1, mounting a secondary battery that is electrically connected to an output portion of the thermoelectric conversion layer having a resin layer.

10. The thermoelectric generation module as claimed in claim 9, mounting an electronic device connected to the secondary battery.

11. The thermoelectric generation module as claimed in claim 1, wherein the thermoelectric conversion layer having a resin layer comprises a carbon nanotube and a binder resin selected from the group consisting of a vinyl compound, a (meth)acrylate compound and a carbonate compound.

12. The thermoelectric generation module as claimed in claim 1, wherein in the region below the wiring connected to the thermoelectric conversion layer having a resin layer, a width w of an adhesion portion is at least 2 times wider than a thickness t of the thermoelectric conversion layer having a resin layer ($w/t \geq 2$).

* * * * *